US006636083B1

(12) United States Patent
Wong et al.

(10) Patent No.: US 6,636,083 B1
(45) Date of Patent: Oct. 21, 2003

(54) LEAKAGE CURRENT CANCELLATION TECHNIQUE FOR LOW POWER SWITCHED-CAPACITOR CIRCUITS

(75) Inventors: Louis Wong, Santa Clara, CA (US); Shohan Hossain, Mountain View, CA (US); Andre Walker, Los Gatos, CA (US)

(73) Assignee: Pacesetter, Inc., Sunnyvale, CA (US)

( * ) Notice: Subject to any disclaimer, the term of this patent is extended or adjusted under 35 U.S.C. 154(b) by 0 days.

(21) Appl. No.: 09/970,630

(22) Filed: Oct. 3, 2001

Related U.S. Application Data

(60) Provisional application No. 60/286,405, filed on Apr. 24, 2001.

(51) Int. Cl.[7] .................................................. H03K 5/00
(52) U.S. Cl. ........................... 327/94; 327/91; 327/95; 327/307; 327/362
(58) Field of Search .......................... 327/91, 94, 95, 327/96, 307, 362

(56) References Cited

U.S. PATENT DOCUMENTS

| 3,638,007 | A | * | 1/1972 | Brooks | 324/605 |
|---|---|---|---|---|---|
| 4,068,254 | A | * | 1/1978 | Erdi | 257/273 |
| 4,484,087 | A | * | 11/1984 | Mazin et al. | 327/203 |
| 4,845,382 | A | * | 7/1989 | Eouzan et al. | 327/72 |
| 5,623,279 | A | * | 4/1997 | Itakura et al. | 307/404 |
| 5,898,336 | A | * | 4/1999 | Yamaguchi | 327/147 |
| 6,421,289 | B1 | * | 7/2002 | Lu et al. | 365/205 |
| 2001/0007537 | A1 | * | 7/2001 | Agawa et al. | 365/203 |

OTHER PUBLICATIONS

Bazarjani, et al.; "A1V Switched–CapacitorΣΔ Modulator"; 1995 IEEE 0–7803–3036–6/95 pp. 70–71.
Bolliri, et al.; "A Micro–Power Mixed Signal IC for Battery–Operated Buglar Alarm Systems"; 2000 ACM 1–58113–190–9/00/0007; pp. 73–77.
Burd, et al.; "Design Issues for Dynamic Voltage Scaling"; 2000 ACM 1–58113–190–9/00/0007; pp. 9–14.
Wong, et al.; "A 1–V CMOS D/A Converter wtih Multi–Input Floating–Gate MOSFET"; IEEE Journal of Solid–State Circuits, vol. 34, No. 10; Oct. 1999; pp. 1386–1390.

* cited by examiner

Primary Examiner—Terry D. Cunningham
(74) Attorney, Agent, or Firm—Steven M. Mitchell

(57) ABSTRACT

An active feedback loop is provided in a switched-capacitor circuit to automatically cancel both junction and sub-Vth channel leakage. Low power consumption that is crucial for implantable medical devices is achieved. The circuit technique largely minimizes the effective leakage current when the switch is turned off. This circuit technique of the invention can be used in many different circuit applications.

10 Claims, 6 Drawing Sheets

LEAKAGE CURRENT CANCELLATION TECHNIQUE FOR LOW POWER SWITCHED-CAPACITOR CIRCUITS

CROSS-REFERENCE TO RELATED APPLICATIONS

This application claims the benefit of U.S. Provisional Application No. 60/286,405, filed Apr. 24, 2001.

STATEMENT REGARDING FEDERALLY-SPONSORED RESEARCH AND DEVELOPMENT

Not applicable.

1. Field of the Invention

The present invention relates generally to implantable cardiac devices, such as implantable cardioverter defibrillators (ICDs). The present invention more particularly relates to reducing ICD integrated circuit (IC) power consumption in such implantable cardiac devices.

2. Background Art

Implantable cardiac stimulation devices, such as implantable cardioverter defibrillators (ICDs), are well known in the art. Such devices may include, for example, implantable cardiac pacemakers and defibrillators either alone or combined in a common enclosure. The devices are generally surgically implanted in a pectoral region of the chest beneath the skin of a patient. The primary components of an ICD include a monitoring and detection mechanism, a capacitor, a battery, a sensing system for detecting an arrhythmia, and a control system for controlling delivery of a capacitive discharge electrical shock in response to a detected arrhythmia. The implantable devices generally function in association with one or more electrode carrying leads which are implanted within the heart. The electrodes are positioned within the heart for making electrical contact with the muscle tissue of their respective heart chamber. Conductors within the leads couple the electrodes to the device to enable the device to deliver the desired electrical therapy.

ICDs are often employed to monitor a patient's heart to detect arrhythmias, which are irregular heartbeats that feature either very rapid ventricular contractions (tachycardia), an excessively slow heartbeat (bardycardia) or, most commonly, extra or "premature" beats. The most common arrhythmia is atrial fibrillation, which is an abnormal rhythm of the heart that can result in an increased risk of stroke due to the formation of emboli (blood clots) in the heart. More specifically, atrial fibrillation is an abnormality of heart rhythm in which chambers of the heart no longer contract in an organized manner. Heart rate often becomes irregular and may be very fast, producing palpitations. Atrial fibrillation can lead to symptoms of heart failure (shortness of breath, edema, palpitations) and chest pains and, when left untreated, occasionally can lead to stroke.

The heart has a right side and a left side. Each side has a chamber that receives blood returning to the heart (an atrium) and a muscular chamber that is responsible for pumping blood out of the heart (a ventricle). Atria are relatively thin-walled chambers, whereas the ventricles are much more muscular. Blood passes from the atria into the ventricles through two processes. During the resting phase, when the ventricles are not contracting, the tricuspid and mitral valves open. Some of the blood that has accumulated in the atria passively flows through the tricuspid and mitral valves into the right and left ventricles, respectively. The atria then contract, pumping blood out and into the ventricles. Once the ventricles fill with blood, they contract, pumping blood out of the ventricles, into the lungs, and to the body.

Contractions of the different chambers of the heart are normally organized in a specific manner. An electrical impulse travels through the heart's chambers and sets off contractions. The heart's "spark plug" is a small area of specialized heart tissue called the SA node, located in the right atrium. Each time this tissue "fires," an impulse travels first through the right and left atria, signaling these chambers to contract and pump blood into the ventricles, and then travels down into a patch of another specialized heart tissue located between the atria and the ventricles, called the AV node. Electrical-wire-like specialized tissue conducts the impulse down into the ventricles, where it signals the right ventricle to contract and to pump blood out and into the lungs, and signals the left ventricle to contract and pump blood out to the rest of the body. Normal sequence of electrical activation of the chambers of the heart is called normal sinus rhythm.

In atrial fibrillation, normal sinus rhythm does not occur. Instead, multiple "wavelets" of electrical impulses travel randomly through the atria, leading to more or less random activation of different parts of the atria at different times. Because the tissues of the right and left atria are not stimulated to contract in an organized manner, the walls of the atria more or less quiver.

Lack of organized contraction by the atria causes several detrimental things to happen. First, because less blood is pumped into the ventricles, there is less blood circulating throughout the body and blood accumulates in the lungs, causing shortness of breath (dyspnea) and other symptoms of heart failure. Second, because the heart is no longer pumping blood into the ventricles, the blood in the atria (particularly in a small part of the left atrium, the left atrial appendage) becomes relatively stagnant. There is a small but real risk that, over time, the stagnant blood will form a blood clot. If a blood clot forms, it may eventually enter the left ventricle and then get pumped out into the body. If this happens, the clot may travel to the brain, block the flow of blood in a cerebral artery, and cause a stroke.

Third, atrial fibrillation can create chest pain (angina). Multiple disorganized wavelets of electrical activity bombard the AV node with electrical impulses. When a great many electrical impulses are conducted through the AV node down into the ventricles, the ventricles contract very rapidly, producing a very fast heart rate. When the ventricles contract too rapidly, less blood is pumped into the body and blood may "back up" into the lungs. Rapid contraction increases the ventricles' demand for oxygen. The demand may exceed the ability of the coronary arteries to supply the ventricles with oxygen-rich blood, causing angina.

When an ICD detects an arrhythmia (e.g., due to atrial fibrillation), the ICD is often used to deliver an appropriate shock to the patient's heart in an attempt to return the heart to normal sinus rhythm. Sometimes, second, third, and fourth (and possibly more) shocks are required in a critical case to return the heart to normal sinus rhythm.

Current ICDs are battery powered. The battery is implanted in the patient as part of the ICD. The types of batteries used in ICDs vary. Battery powered implantable medical devices require many years of continuous operation. Low power consumption is the most important criteria in designing the IC. It is very well known that reducing the supply voltage is one of the most effective ways to reduce power consumption. See, T. Burd, R. Brodersen, "Design Issues for Dynamic Voltage Scaling", *IEEE Symposium on Low Power Electronics, Digest of Technical papers*, pp 9–14, July 2000, and L. Wong, C. Kwok, G. Rigby, "A 1-V CMOS D/A Converter with Multi-Input Floating-Gate MOSFET" *IEEE Journal of Solid States Circuits*, pp. 1386–1390, October 1999. Lowering the operating voltage puts harder constraints on the analog circuits, as lower voltages are available to turn on the transistor. Low threshold voltage (Vth) processes have been developed to target low voltage operations. See, S. Bazarjani, W. Snelgrove, "IV Switched-Capacitor ΣΔ Modulator", *IEEE Symposium on Low Power Electronics digest of tech papers*, pp70–73, October 1995 and T. Adachi, et al, "A 1.4V Switched-Capacitor Filter," *Proc. IEEE CICC*, pp8.2.1–8.2.4, May 1990. In addition, as devices shrink in the deep sub-micron processes, transistors are also expected to operate in low supply voltages in order to maintain long term reliability. The drawback of these low Vth or sub-micron processes is that they significantly increase the leakage current. This increase in leakage current has a very significant impact on switched-capacitor implementations of analog circuits.

Low power consumption is crucial for implantable medical devices. Reducing supply voltage is well known to minimize power dissipation. Transistor's Vth are becoming lower, driven by low supply voltage and shrinking technology. However, low Vth transistors have high leakage currents which impact the performance of switched-capacitor circuits, sample and hold amplifiers, and more.

What is needed is a mechanism for reducing transistor leakage current in such a way that power dissipation is minimized and supply voltage is reduced.

BRIEF SUMMARY OF THE INVENTION

The present invention addresses the common problem seen in switched-capacitor circuits as a result of transistor leakage current. The new technique can significantly minimize the effective leakage current to regain circuit performance. This technique also achieves both minimal silicon area and low power operation. The new circuit technique of the invention largely minimizes the effective leakage current when the switch is turned off by employing an active feedback loop to automatically cancel both junction and sub-Vth channel leakage. This general technique of the invention can be used in many different circuit applications.

BRIEF DESCRIPTION OF THE DRAWINGS/FIGURES

Further features and advantages of the present invention may be more readily understood by reference to the following description taken in conjunction with the accompanying drawings. Like numerals or reference designators will be used to refer to like parts or elements throughout.

DETAILED DESCRIPTION OF THE INVENTION

The following description is of the best modes presently contemplated for practicing the invention. This description is not to be taken in a limiting sense but is made merely for the purpose of describing the general principles of the invention. The scope of the invention should be ascertained with reference to the claims.

Exemplary Stimulation Device

Figure 1:
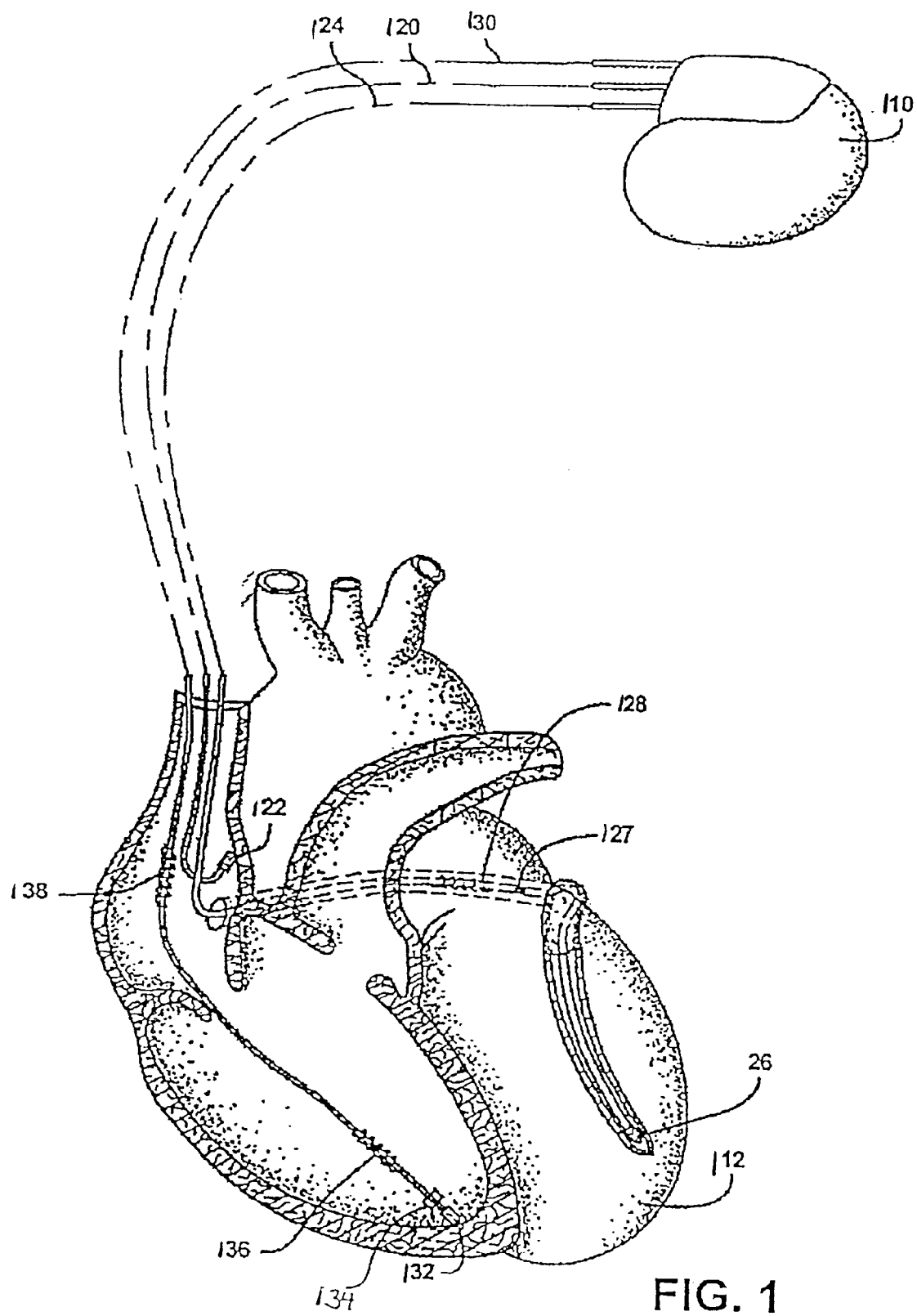
FIG. 1 is a simplified diagram illustrating an implantable stimulation device in electrical communication with at least three leads implanted into a patient's heart for delivering multi-chamber stimulation and shock therapy.

FIG. 1 shows an exemplary implantable cardiac stimulation device 110 (also referred to as a pacing device, a pacing apparatus, or an ICD) in electrical communication with a patient's heart 112 by way of three leads, 120, 124 and 130, suitable for delivering multi-chamber stimulation and shock therapy. To sense atrial cardiac signals and to provide right atrial chamber stimulation therapy, the stimulation device 110 is coupled to an implantable right atrial lead 120 having at least an atrial tip electrode 122, which typically is implanted in the patient's right atrial appendage.

To sense left atrial and ventricular cardiac signals and to provide left-chamber pacing therapy, the stimulation device 110 is coupled to a "coronary sinus" lead 124 designed for placement in the "coronary sinus region" via the coronary sinus for positioning a distal electrode adjacent to the left ventricle and/or additional electrode(s) adjacent to the left atrium. As used herein, the phrase "coronary sinus region" refers to the vasculature of the left ventricle, including any portion of the coronary sinus, great cardiac vein, left marginal vein, left posterior ventricular vein, middle cardiac vein, and/or small cardiac vein or any other cardiac vein accessible by the coronary sinus.

Accordingly, an exemplary coronary sinus lead 124 is designed to receive atrial and ventricular cardiac signals and to deliver left ventricular pacing therapy using at least a left ventricular tip electrode 126, left atrial pacing therapy using at least a left atrial ring electrode 127, and shocking therapy using at least a left atrial coil electrode 128.

The stimulation device 110 is also shown in electrical communication with the patient's heart 112 by way of an implantable right ventricular lead 130 having, in this embodiment, a right ventricular tip electrode 132, a right ventricular ring electrode 134, a right ventricular (RV) coil electrode 136, and an SVC coil electrode 138. Typically, the right ventricular lead 130 is transvenously inserted into the heart 112 so as to place the right ventricular tip electrode 132 in the right ventricular apex so that the RV coil electrode 136 will be positioned in the right ventricle and the SVC coil electrode 138 will be positioned in the superior vena cava. Accordingly, the right ventricular lead 130 is capable of receiving cardiac signals and delivering stimulation in the form of pacing and shock therapy to the right ventricle.

Figure 2:
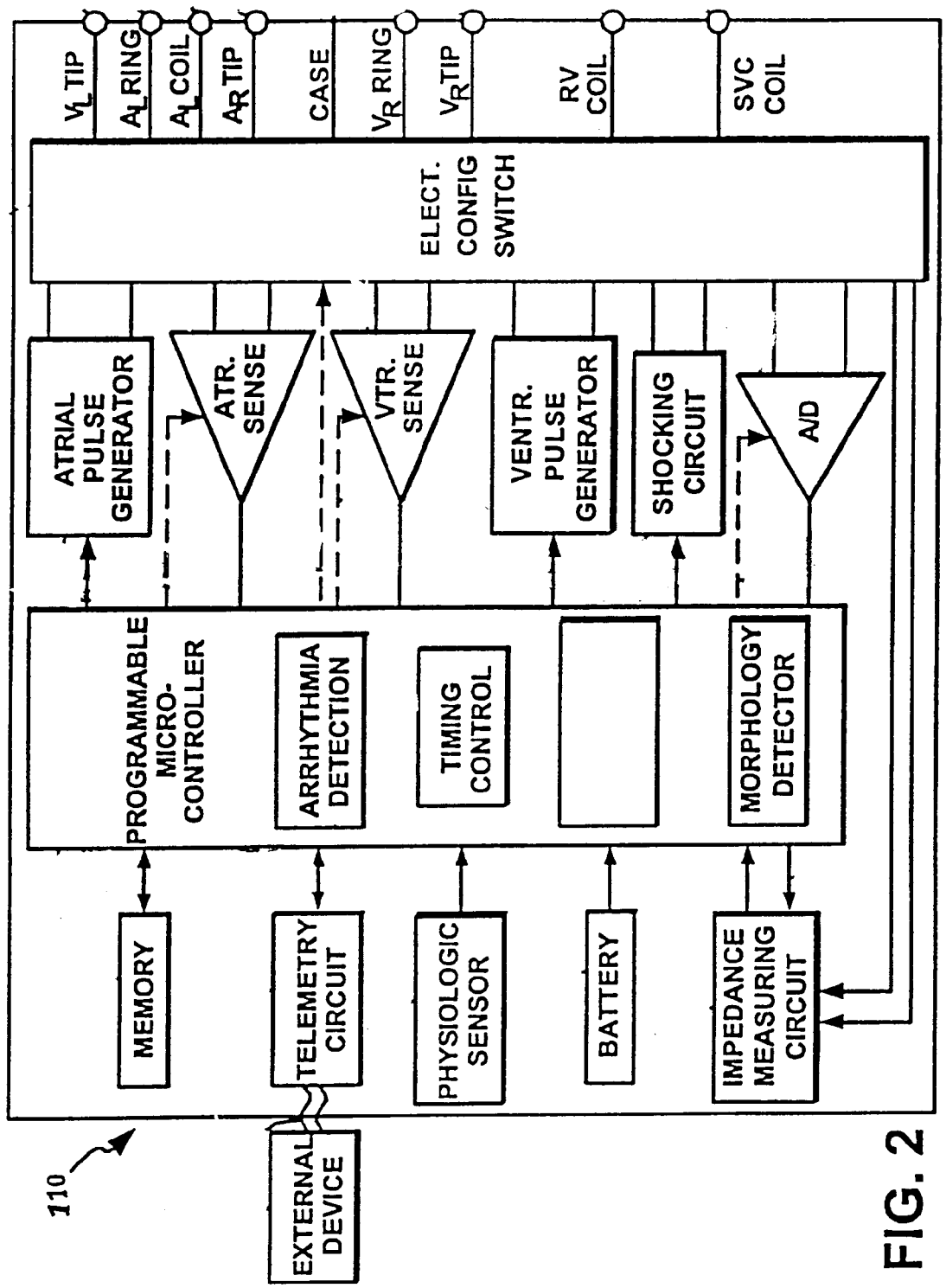
FIG. 2 is an illustration of a functional block diagram of a multi-chamber implantable stimulation device that incorporates the elements of the present invention.

FIG. 2 is a simplified block diagram of an exemplary multi-chamber implantable cardiac stimulation device 110 which incorporates the present invention. Stimulation device 110 is capable of treating both fast and slow arrhythmias with stimulation therapy, including cardioversion, defibrillation, and pacing stimulation. While a particular multi-chamber device is shown, this is for illustration purposes only, and one of skill in the art could readily duplicate, eliminate or disable the appropriate circuitry in any desired combination to provide a device capable of treating the appropriate chamber(s) with cardioversion, defibrillation and pacing stimulation. Additional details of stimulation device 110 are disclosed in co-pending, commonly assigned application Ser. No. 09/861,230, filed May 17, 2001 in the name of Mark W. Kroll, titled "METHODS AND DEVICES FOR RAPID DELIVERY OF SECONDARY CARDIAC SHOCKS." The device of the present invention is incorporated into the blocks labeled ATR SENSE" and "VTR SENSE" in FIG. 2.

In many medical applications, the input signals (such as cardiac rhythm sensing or neuro-responses from the body) have a relatively low frequency spectrum, often, a corner frequency as low as ~0.1 Hz. Therefore, sample and hold amplifier (SHA) circuits, switched-capacitor filters or amplifiers must be able to handle hundreds of ms of hold time. In a standard sub-micron CMOS process, the leakage current of a transistor is on the order of pA. It may be much higher for a low Vth deep sub-micron process.

Figure 3:
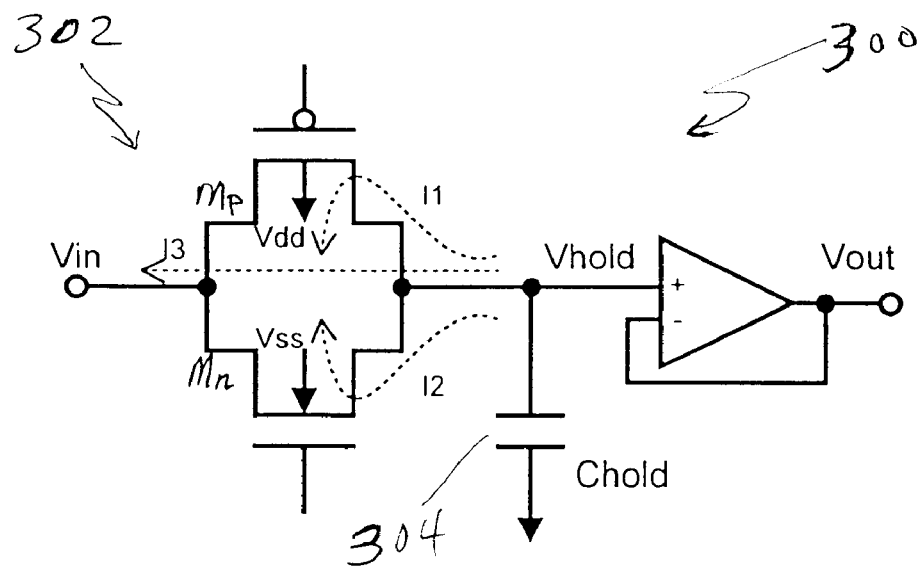
FIG. 3 shows a basic sample and hold amplifier (SHA) using a CMOS switch and a hold capacitor.

FIG. 3 shows a basic SHA 300 using a solid state, preferably CMOS, switch 302 having switch elements $M_p$ and $M_n$, and a holding capacitor $C_{hold}$ 304.

Typically, if a 1 pF holding capacitor 304 is used with a holding period of 100 ms, then 1 pA of leakage will cause a 0.1V drift at the end of the holding period. This is unacceptable in applications where sensitivity in the range of mV or $\mu$V is required. A typical solution to overcome this problem is to use a much larger capacitor (say 10–30 pF). However, a larger capacitor requires a much stronger driver at the previous stage and more supply current is needed. A larger capacitor also increases silicon area significantly.

There are two main types of leakage currents from a CMOS transistor: (a) the drain/source to body junction leakage and (b) the sub-Vth drain to source channel leakage. Three leakage paths are shown in FIG. 3. I1 is the junction leakage to Vdd, I2 is the junction leakage to Vss, and I3 is the channel leakage. The total effective leakage current seen by the holding capacitor 304 is the sum of I1+I2+I3.

Figure 4:
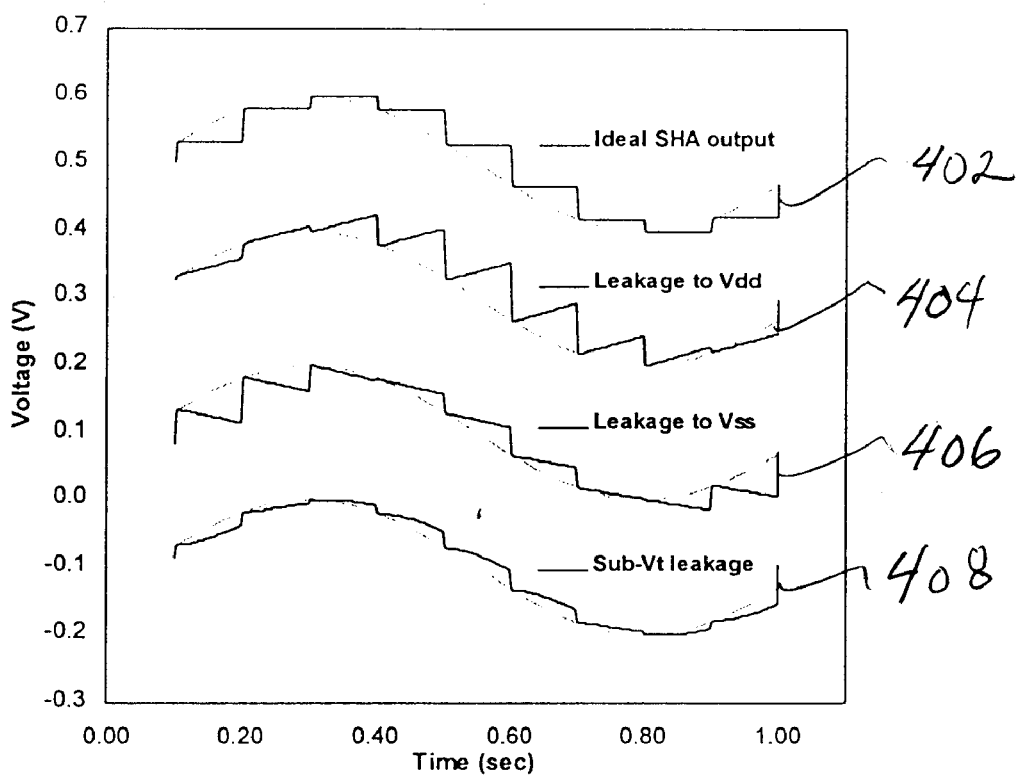
FIG. 4 shows some example waveforms from the SHA of FIG. 3.

FIG. 4 shows some example waveforms from the SHA 300. A sine wave is used as an input. The first waveform 402 is an ideal sample and hold output. The second waveform 404 is an example of I1 being the dominant leakage current, where the output drifts to Vdd during the hold period. The third or fourth waveforms 406 or 408 are expected if leakage currents I2 or I3, respectively, are dominant. These output drifts may also cause harmonic distortion in some situations. This example is just one of the many switched-capacitor type of circuits which can be affected by a transistor's leakage.

Figure 5:
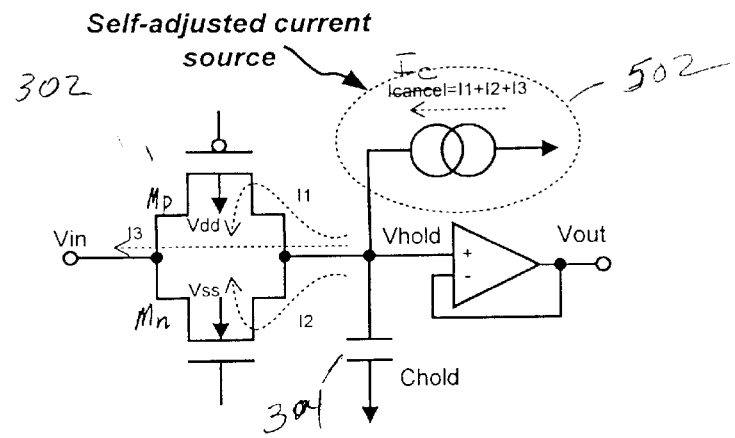
FIG. 5 illustrates the concept of the leakage current cancellation technique of the invention.

FIG. 5 represents the concept of the present invention to significantly reduce the effective leakage current. A self-adjusted current source 502 is introduced to the system. When the CMOS switch 302 is turned off, a compensating current $I_c$ is injected to the high impedance node $V_{hold}$. This current is self-adjusted such that it is equal to the sum of I1+I2+I3, but in the opposite direction. As a result, all leakage currents cancel out at node $V_{hold}$. The effective leakage seen by the hold capacitor 304 is virtually zero. In this way, the hold capacitor 304 can be kept very small without the voltage drifting away.

Therefore, the driver at the previous stage can be kept very small and minimum current is needed. This design allows low power operation and requires minimal silicon area. In fact, the current source circuit 502 actually takes up less space than the large $C_{hold}$ capacitors previously used to minimize current leakage and voltage drift.

Figure 6:
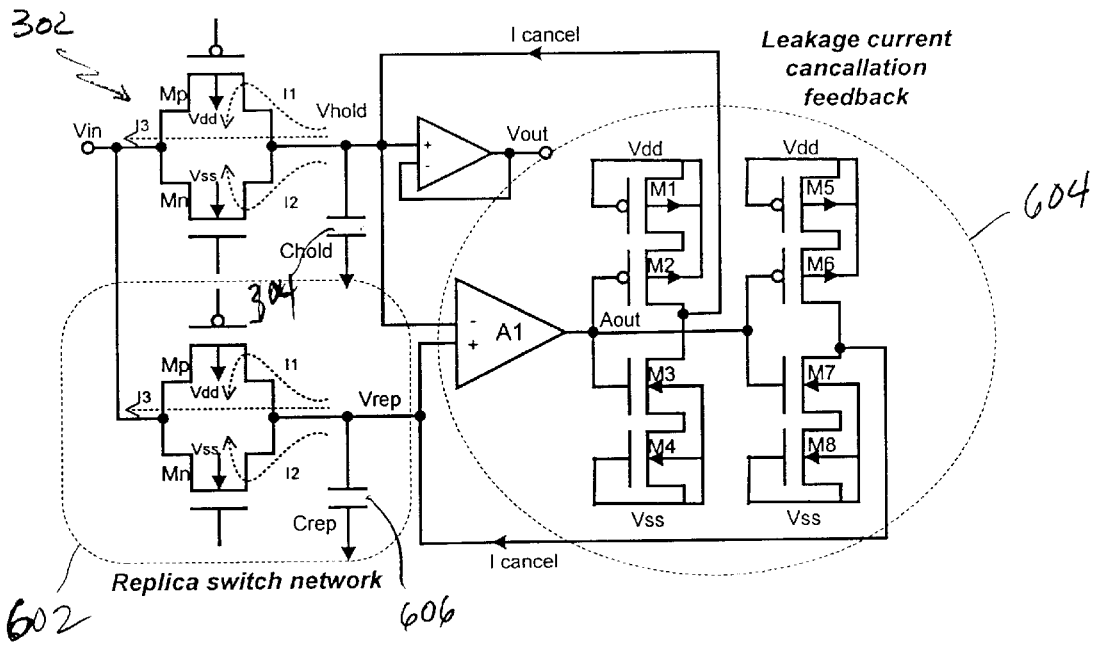
FIG. 6 shows one embodiment of the leakage current cancellation circuit of the invention.

One implementation of a self adjusted current source 502 is shown in FIG. 6. A replica CMOS switch network 602 and a current cancellation feedback circuit 604 are introduced. The replica CMOS switch 602 is identical to the main switch 302, except that the replica capacitor $C_{rep}$ 606 is much smaller than the main capacitor 304. For the purposes of explanation, assume the current cancellation feedback circuit 604 (comprising transistors MI-M8 and operational amplifier (opamp) A1) is omitted from the system. Under this configuration, the leakage current on the main switch network 302 is the same as the replica network 602. The voltage drift on the replica node $V_{rep}$ is much larger than that on the main node $V_{hold}$, since capacitor 606 is smaller than capacitor 304 and voltage drift is proportional to capacitor size.

Figure 7:
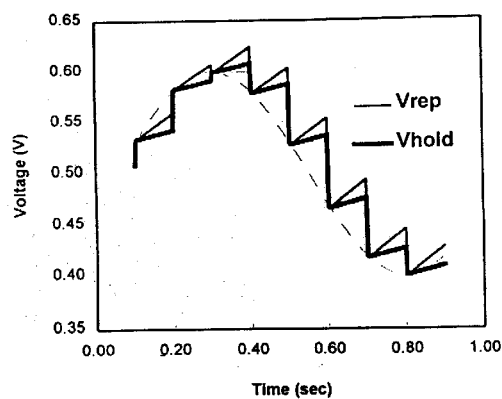
FIG. 7 shows example waveforms of $V_{hold}$ and $V_{rep}$, without a self-adjusted current feedback network.

FIG. 7 shows an example waveform of the voltage at nodes $V_{rep}$ and $V_{hold}$ in the assumed example that current cancellation feedback circuit 604 is omitted from the system. As long as leakage currents exist at the switches, a voltage difference is expected on nodes $V_{rep}$ and $V_{hold}$.

In the actual implementation, the current cancellation feedback circuit 604 is included in the complete system. Transistors M1, M4, M5 and M8 are the "leakage transistors"; they all have a zero gate-source voltage. Their dimensions are much larger than the sample and hold switch elements, $M_p$ and $M_n$. These "leakage transistors" can be viewed as constant current sources, with currents that are higher than the $M_p$ and $M_n$ leakage currents. By utilizing operational amplifier A1 and a push-pull output stage with the "leakage transistors" M1, M4, M5 and M8, a closed loop system is formed. The closed loop continuously monitors the voltage difference between $V_{hold}$ and $V_{rep}$, and injects a counter-current to cancel the switch leakage current accordingly. The system will reach a quiescent mode at which the feedback current is equal to the switch leakage current. At that point, both $Vh_{hold\ and\ Vrep}$ will not drift any further. Both junction and channel leakages are taken into consideration and are canceled out by the feedback network 604.

Theoretically, if the operational amplifier A1 has an infinite voltage gain, zero input offset voltage, and all transistors are perfectly matched, then all the leakage currents from the CMOS switch will be perfectly canceled out. The effective leakage current seen by the capacitors will be absolutely zero. However, transistors can never be matched perfectly on real silicon. The opamp A1 will always have finite gain and offset error. The voltage difference between $V_{hold}$ and $V_{rep}$ under the closed-loop quiescent mode can be expressed as:

$$V_{diff} = V_{hold} - V_{rep} = \frac{A_{out}}{A} + V_{offset} \qquad (1)$$

where A is the opamp gain, $A_{out}$ is the opamp output voltage, and $V_{offset}$ is the opamp input offset voltage.

This voltage difference will lead to a leakage current mismatch between the main and replica switches. It can be shown that the voltage drift on the node $V_{hold}$ in this closed loop system can be expressed as:

$$\frac{dV_{hold}}{dt} = \frac{I_{delta}}{C_{hold} - C_{rep}} \quad (2)$$

where $I_{delta}$ is the current mismatch between the main and replica switches from equation (2), and the voltage drift on $V_{hold}$ depends on leakage current mismatch and capacitor sizes. The current mismatch can be minimized by performing careful layouts and having a high open loop gain opamp. Also, the smaller the $C_{rep}$, the smaller the voltage drift will be. However, it should be noted that if $C_{rep}$ is too small, the clock injection can be severe which introduces offset error during the holding period. Therefore, there is an optimum $C_{rep}$ value for every circuit.

Figure 8:
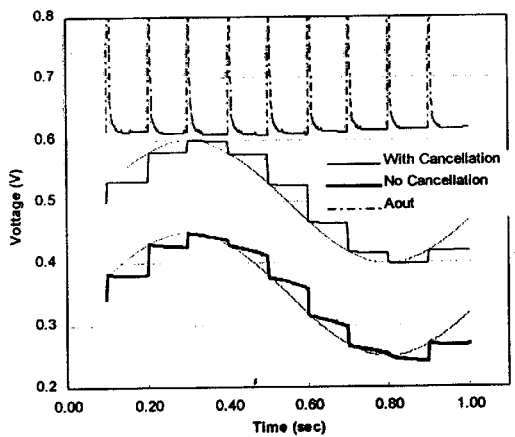
FIG. 8 shows a simulated waveforms of the SHA circuit shown in FIG. 6 with and without the leakage cancellation technique.

FIG. 8 shows a simulated waveform of the SHA circuit described in FIG. 6, with $C_{hold}$=0.5 pF and $C_{rep}$=0.1 pF. Opamp A1 is a single stage design, which consumes only a few nA. The voltage drift during hold mode is 9.5 mV/sec, whereas the uncompensated drift has 200 mV/sec. More than 20× of improvement is observed by using the technique of this invention.

Figure 9A:
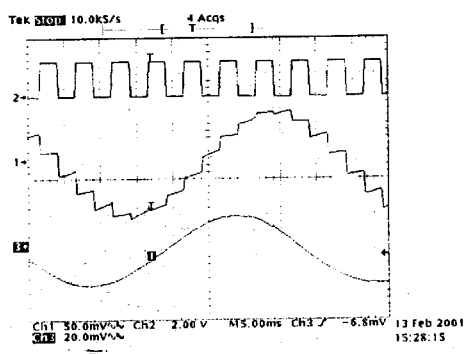
FIG. 9A shows ordinary uncompensated output.
Figure 9B:
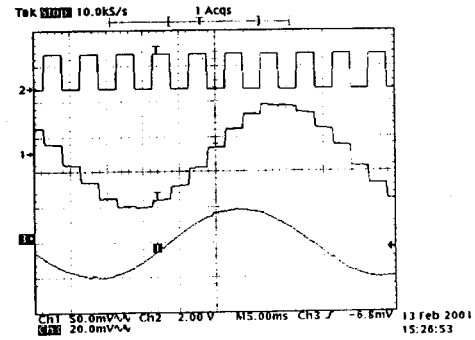
FIG. 9B shows leakage-cancellation output.

The SHA described above is one of the many possible applications where the technique of this invention can be used. This leakage cancellation technique can be applied to many different circuits that involve switches and capacitors. A switched-capacitor low-pass filter was implemented on a test chip amongst other analog circuits. It was fabricated in a 2-poly 3-metal 0.5 μm technology. FIG. 9A shows the measured waveform of an ordinary output and FIG. 9B shows a leakage-cancellation output using the invention.

Figure 10A:
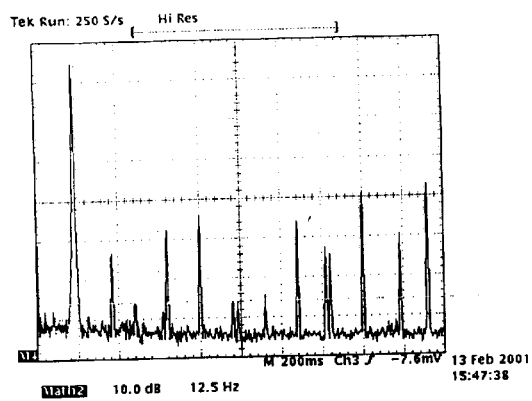
FIG. 10A illustrates an FFT of ordinary uncompensated output.
Figure 10B:
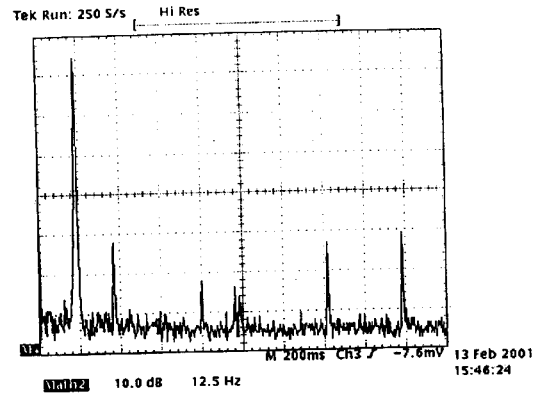
FIG. 10B illustrates an FFT of leakage-cancellation output.

FIGS. 10A and 10B shows the frequency spectrum of the outputs. The signal-to-noise ratio of the ordinary output (FIG. 10A) is ~30 dB, whereas the leakage-cancelled output (FIG. 10B) is ~45 dB.

A leakage current compensation technique for low power switched-capacitor circuits has been disclosed. It largely eliminates the effective leakage current. Hence smaller capacitors can be used, achieving low power operation and small silicon area. The technique of the invention can be applied to many different circuits.

The foregoing description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. Apparatus for reducing leakage current in a low power switched capacitor circuit, comprising:
   a first low power solid state switch including a hold capacitor;
   a second low power solid state switch, including a replica capacitor, coupled to said first solid state switch, said replica capacitor having a smaller capacitance than said hold capacitor; and
   a self adjusted current source coupled to said first and second solid state switches, for generating a current that is substantially equal to and opposite from a leakage current generated by said first solid state switch.

2. Apparatus according to claim 1, wherein, in an "OFF" state, said first solid state switch generates a first junction leakage current I1, a second junction leakage current I2, and a channel leakage current I3; and
   said self adjusted current source generates a current substantially equal to the sum of I1+I2+I3, in the opposite direction to the sum of I1+I2+I3.

3. Apparatus according to claim 2, wherein said self adjusted current source comprises:
   a constant current source for generating a counter current that is greater than either of said first and second junction leakage currents;
   means for monitoring a voltage difference between said first and second solid state switches; and
   means for injecting said counter current into said first solid state switch when said monitoring means detects a voltage difference between said first and second solid state switches.

4. Apparatus according to claim 3, wherein
   said first solid state switch is a CMOS switch, comprising first and second switch elements coupled to sad holding capacitor; and
   said first solid state switch is a CMOS switch, comprising first and second switch elements coupled to said replica capacitor.

5. Apparatus for reducing leakage current in a low power switched capacitor circuit, comprising:
   a low power solid state switch circuit, wherein, in an OFF state, said solid state switch circuit generates a leakage current; and
   a self adjusted current source coupled to said solid state switch circuit, for generating a counter current that is substantially equal to and opposite from the leakage current generated by said solid state switch circuit,
   wherein said solid state switch circuit comprises:
      a first low power solid state switch, wherein in an OFF state, said first solid state switch generates a first leakage current;
      a second low power solid state switch, wherein in an OFF state, said second solid state switch generates a second leakage current;
      means for measuring a voltage difference between said first and second solid state switches as a function of said first and second leakage currents; and
      means for providing said counter current to said first and second solid state switches as a function of the measured voltage difference.

6. Apparatus according to claim 5, wherein:
   said first solid state switch includes a holding capacitor; and
   said second solid state switch includes a replica capacitor, said replica capacitor having a smaller capacitance than said holding capacitor.

7. Apparatus according to claim 6, wherein,
   in an "OFF" state, said first solid state switch generates a first junction leakage current I1, a second junction leakage current I2, and a channel leakage current I3; and
   said self adjusted current source generates a current substantially equal to the sum of I1+I2+I3, in the opposite direction to the sum of I1+I2+I3, where the sum of I1+I2+I3 is said first leakage current.

8. Apparatus according to claim 7, wherein each of said leakage currents I1+I2+I3 flows in the same direction.

9. Apparatus according to claim 8, wherein
said first solid state switch is a CMOS switch, comprising first and second switch elements coupled to said holding capacitor; and
said second solid state switch is a CMOS switch, comprising first and second switch elements coupled to said replica capacitor.

10. Apparatus according to claim 5, wherein said self adjusted current source comprises:
a constant current source for generating a counter current that is greater than either of said first and second junction leakage currents; and
means for injecting said counter current into said solid state switch circuit when said measuring means detects a voltage difference between said first and second solid state switches.

* * * * *